United States Patent
Robinson

(10) Patent No.: US 7,189,109 B2
(45) Date of Patent: Mar. 13, 2007

(54) MODULAR WATTHOUR METER SOCKET AND TEST SWITCH

(75) Inventor: Darrell Robinson, Highland, MI (US)

(73) Assignee: Ekstrom Industries, Inc., Farmington Hills, MI (US)

( * ) Notice: Subject to any disclaimer, the term of this patent is extended or adjusted under 35 U.S.C. 154(b) by 0 days.

(21) Appl. No.: 10/956,838

(22) Filed: Oct. 1, 2004

(65) Prior Publication Data

US 2005/0122094 A1 Jun. 9, 2005

Related U.S. Application Data

(60) Provisional application No. 60/508,787, filed on Oct. 3, 2003.

(51) Int. Cl.
*H01R 33/945* (2006.01)

(52) U.S. Cl. .................................. 439/517

(58) Field of Classification Search ............. 439/517, 439/146, 167, 508; 361/111, 118, 127, 120, 361/126, 641–646; 324/156, 110
See application file for complete search history.

(56) References Cited

U.S. PATENT DOCUMENTS

| | | | |
|---|---|---|---|
| 3,170,090 A | 2/1965 | Waldrop | |
| 3,590,376 A * | 6/1971 | Mindt et al. | 324/156 |
| 4,588,949 A * | 5/1986 | Becker et al. | 324/110 |
| 5,129,841 A | 7/1992 | Allina et al. | |
| 5,184,119 A | 2/1993 | Stanbury et al. | |
| 5,227,668 A | 7/1993 | Mutch et al. | |
| 5,293,115 A | 3/1994 | Swanson | |
| 5,423,695 A * | 6/1995 | Robinson et al. | 439/517 |
| 5,473,322 A | 12/1995 | Carney | |
| 5,485,393 A | 1/1996 | Bradford | |
| 5,488,565 A | 1/1996 | Kennon et al. | |
| 5,523,559 A | 6/1996 | Swanson | |
| 5,586,913 A * | 12/1996 | Robinson et al. | 439/638 |
| 5,590,179 A | 12/1996 | Shincovich et al. | |
| 5,595,506 A * | 1/1997 | Robinson et al. | 439/638 |
| 5,617,084 A | 4/1997 | Sears | |
| 5,631,843 A | 5/1997 | Munday et al. | |
| 5,704,804 A * | 1/1998 | Robinson et al. | 439/517 |
| 5,940,009 A | 8/1999 | Loy et al. | |
| 5,944,555 A | 8/1999 | Robinson et al. | |
| 6,054,930 A | 4/2000 | Guillon | |
| 6,118,269 A | 9/2000 | Davis | |
| 6,232,886 B1 | 5/2001 | Morand | |
| 6,236,197 B1 | 5/2001 | Holdsclaw et al. | |
| 6,362,745 B1 | 3/2002 | Davis | |
| 6,549,388 B2 * | 4/2003 | Robinson | 361/111 |
| 2002/0074990 A1 * | 6/2002 | Shincovich | 324/110 |

* cited by examiner

*Primary Examiner*—J. F. Duverne
(74) *Attorney, Agent, or Firm*—Young Basile Hanlon MacFarlane & Helmholdt

(57) ABSTRACT

A watthour meter has, in one aspect, a flexible seal with a locking head carried on the meter base and a strap extending from the head and disposable in a loop around and through apertures in juxtaposed mounting flanges of the meter base and the meter dome to lockably join the dome and base. A tamper detector is carried on a blade moveably extending through the base. Movement of the blade during separation of the meter from the meter socket jaw contacts triggers the tamper detector. A connecting pin extends through aligned openings in the base and the dome to non-separably join the base and the dome. The pin engages a tamper signaling switch to provide an indication of a change of in pin state during a tamper event.

23 Claims, 13 Drawing Sheets

MODULAR WATTHOUR METER SOCKET AND TEST SWITCH

CROSS REFERENCE TO CO-PENDING APPLICATION

This application claims the benefit of the filing date of co-pending U.S. Provisional Patent Application Ser. No. 60/508,787, filed Oct. 3, 2003, the contents of which are incorporated herein in its entirety.

BACKGROUND

The present invention relates, in general, to watthour meters and/or watthour meters socket adapters.

Electrical power is supplied by an electric utility to individual use sites by power line conductors which extend from the utility poles to a meter socket mounted on a convenient surface at the use site. The power line conductors are physically connected to line jaw contacts in the meter socket. Distribution conductors extend from load jaws mounted in the socket throughout the use site.

An electric power watthour meter is provided for measuring the power consumed by a use site by measuring the current drawn by the use site from the line to the load conductors. A watthour meter typically has a base on which metering components are mounted. Blade terminals extend from the base for interconnection in the socket line and load jaw contacts so as to place the meter in series between the power line conductors and the power load conductors. A dome historically formed of glass surrounds the electromechanical metering components mounted on the watthour meter base. The dome includes a mounting flange which overlays a flange on the base and is fixed to the base by a metal mounting ring. A seal is used to then secure the dome to the base.

With the advent of electronic meters and automatic meter reading equipment, the glass dome has been replaced with a plastic dome or cover typically having a view window in an end wall for viewing an electronic display of power consumption. The mounting flange on the plastic domes are formed with slots for engagement with a standard meter base carrying the blade terminals and metering components.

The watthour meter is installed in the socket and/or in a socket adapter or socket extender which is mounted in the socket which also carries mating jaw contacts by inserting the meter blade terminals into the meter socket or socket adapter jaw contacts.

A concern which arises with any watthour meter design, whether of the automatic reading type or a more conventional, electronic or mechanical watthour meter, is the ability to detect tampering with the meter, such as the removal of the meter to insert wires to bypass the meter and thereby obtain free, unmetered power. In addition to removing the meter, certain tampering events involve the removal and the replacement of the meter in an inverted position in the socket so as to cause reversal of the rotation of the measuring disk.

Other tampering efforts have involved separation of the meter dome from the meter base to enable tampering with the internal mechanical, electronic, or electrical components of the meter in order to obtain free power.

On-site inspections of watthour meter mounting configuration by utility personnel have become less frequent. This has encouraged would be tamperers to increase their efforts to unauthorizedly obtain electric power from the meter socket without payment. This is despite the elaborate anti-tampering design features built into each watthour meter, meter socket adapter and meter socket and other tampering detection circuits and devices.

Older tamper detection devices were mechanical in nature and frequently included an orientation sensitive switch, also known as a tilt switch, which detected reverse mounting of the watthour meter in the socket after the meter is first removed from the socket. Once removed, a single phase meter could be installed upside down resulting in reverse rotation of the meter disc and register dials which record cumulative energy consumption. The existence of a single tampering event or the recording of the number of times a tampering event was typically detected and stored in a memory device in the watthour meter.

While effective, such mechanical tampering detection devices still require some type of on-site inspection to determine the tamper detection elements detected a tampering event.

One method of providing a tamper indication between the meter dome or cover and the meter base is shown in FIG. 1 and involves the use of a metal T-shaped seal. The seal, which typically is formed of aluminum, has a generally flat head and an elongated, bendable stem. The stem is inserted through aligned apertures in the metal band surrounding the meter dome flange and the base flange.

During assembly of the watthour meter, after the dome is mounted on the base, the T-seal is inserted stem first through aligned apertures in the ring and base. As the end of the stem passes through an aperture in the base it encounters a ramp surface which bends the end of the stem out of the plane of the remainder of the stem. The end is further bent back manually over the stem itself as shown in FIG. 1 to lock the seal on the base.

In use, any attempt to pull the T-seal from the base, will cause the bent end to sever from the remainder of the stem thereby providing an indication of a tamper event.

However, since the meter is normally mounted in a socket when tampering occurs, the separation of the end of the stem from the T-seal causes the short metal end to fall into the interior of the socket which is carrying voltage. This metal piece could create a dangerous arcing condition.

Thus, it would be desirable to provide a safer means for sealing or providing a tamper indication lock of a meter dome and/or a cover to a meter base which avoids problems associated with prior art meter seals.

It would also be desirable to provide a watthour meter having an approved tamper event detection which effectively detects any initial separation of a watthour meter from the meter socket jaws which is capable of providing a tamper detection event signal which can be transmitted internally and/or externally of the watthour meter.

SUMMARY

The present invention is a watthour meter having improved tamper detection features over previously devised watthour meters.

The watthour meter of the present invention is formed of a base carrying metering components and a dome coupled to the base.

In one aspect, a receiver means is carried on the base. A seal in the form of a flexible tie having a strap which is looped through apertures in the joined meter base and cover extends through a locking head on the tie for non-releasably securing the flexible tie to the base and cover. Separation of the tie is an indication of tampering.

The receiver means may comprise a receptacle on the base for receiving the locking head of the tie. Apertures are formed in the receiver means for receiving the strap of the tie in a loop configuration around edges of the base and the dome.

In another aspect of the present invention, a hanger is provided for hanging the watthour meter in a vertical orientation prior to installation of the watthour meter in the meter socket. A fastener is mounted in a closed bore in the base and pivotally attaches the hanger to the base. The fastener extends through a hollow post formed in the base and is completely insulated from the electrical power carrying components of the meter. A projection is carried on the base for angularly positioning the hanger in a meter hanging position as well as to secure the hanger in a storage position for use of the meter.

In another aspect of the present invention, tamper detection means is provided for detecting a separation of the watthour meter from a meter socket. The tamper detection means includes at least one blade moveably carried in the base and adapted for connection to a watthour meter socket jaw contact. Tamper signaling means is responsive to the detection of movement of the blade upon separation of the watthour meter from the meter socket jaw contact and provides a tamper detection signal.

In one aspect, the tamper signaling means is a switch having a switchable contact which provides an electrical signal upon detection of blade movement. The tamper signal may be used within the watthour meter to provide a visual and/or audible signal of a tamper event and/or transmitted remotely from the watthour meter for an external tamper indication.

In another aspect, a connecting or seal pin extends through aligned openings in the base and the dome and is latched to one of the base and the dome. An inner end of the pin engages a tamper detecting means or switch to provide an indication of a change of state of the pin. The pin also non-rotatably and non-separably joins the meter dome and meter base.

The watthour meter of the present invention contains several unique features which overcome deficiencies found in previous watthour meters. The unique seal formed of a flexible tie with locking head provides a dome/base tamper indicating seal which prevents rotation between the cover and dome while at the same time is formed of an electrically insulating material to minimize any arcing or short circuits with current carrying components in the meter socket in the event of separation of any portion of the seal or tie from the watthour meter. The seal or tie receiver is integrated into the base and cooperates with apertures in the receiver, base and cover to provide the desired mounting of the seal by a simplified, low cost construction.

The present invention also provides a unique fastener for pivotally coupling the temporary mounting hanger to the base which is completely electrically insulated from the meter components to prevent the formation of a conductive path through the hanger to the interior of the meter.

A unique tamper detection means is provided in the form of means for detecting movement of a unique moveably mounted blade on the base. The moveable blade exhibits movement relative to the bottom wall of the base during the initial stages of separation of the watthour meter from the meter socket jaw contacts. This movement is detected by the tamper detector means which generates a signal to provide an indication of tampering. The signal can be in multiple forms for use on the watthour meter or being capable of being sent remotely from the watthour meter to a central utility station.

In one aspect, a connecting or seal pin extends through the base and the dome and is latched to one of the base and dome to non-separably and non-rotatably join the base and the dome. The connecting pin engages a tamper detecting device or switch which generates a tamper event indication signal during a change of state or position of the connecting pin.

BRIEF DESCRIPTION OF THE DRAWING

The various features, advantages and other uses of the present invention will become more apparent by referring to the following detailed description and drawing in which.

DETAILED DESCRIPTION

Figure 1:
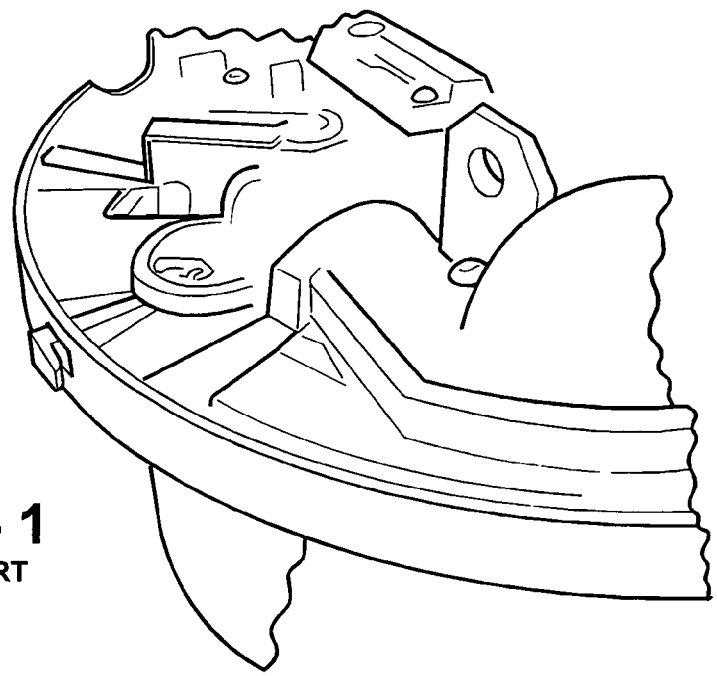
FIG. 1 is a partial perspective view of a prior art T-seal on a watthour meter.

Referring now to the drawing and to FIGS. 2–12 in particular, there is depicted a watthour meter 20 having a meter dome/cover/meter base tamper indicator or seal means 22, constructed in accordance with one aspect of the present invention, mounted thereon. The meter dome or cover, hereafter referred to simply as the dome 24, has a generally cylindrical shape formed of a cylindrical side wall 26 extending from a first end 28 at a closed end wall 30 to an opposed end 32 which is formed as a mounting flange having a top annular ledge 34 and an axially extending rim 36. The ledge 34 and the rim 36 form a step which disposes the rim 36 at a slightly larger outer diameter than the diameter of the side wall 26. This allows the end 32 of the dome 24 to overlay and engage a complementary formed rim on a meter base 40.

The meter dome 24 is formed of a suitable electrical insulting material. While the dome 24 could be formed of glass, a more cost-effective material is an electrically insulating plastic. The meter dome 24 could be formed of a transparent material, such as a transparent plastic, for ease in viewing the interior metering component power consumption display.

Figure 2:
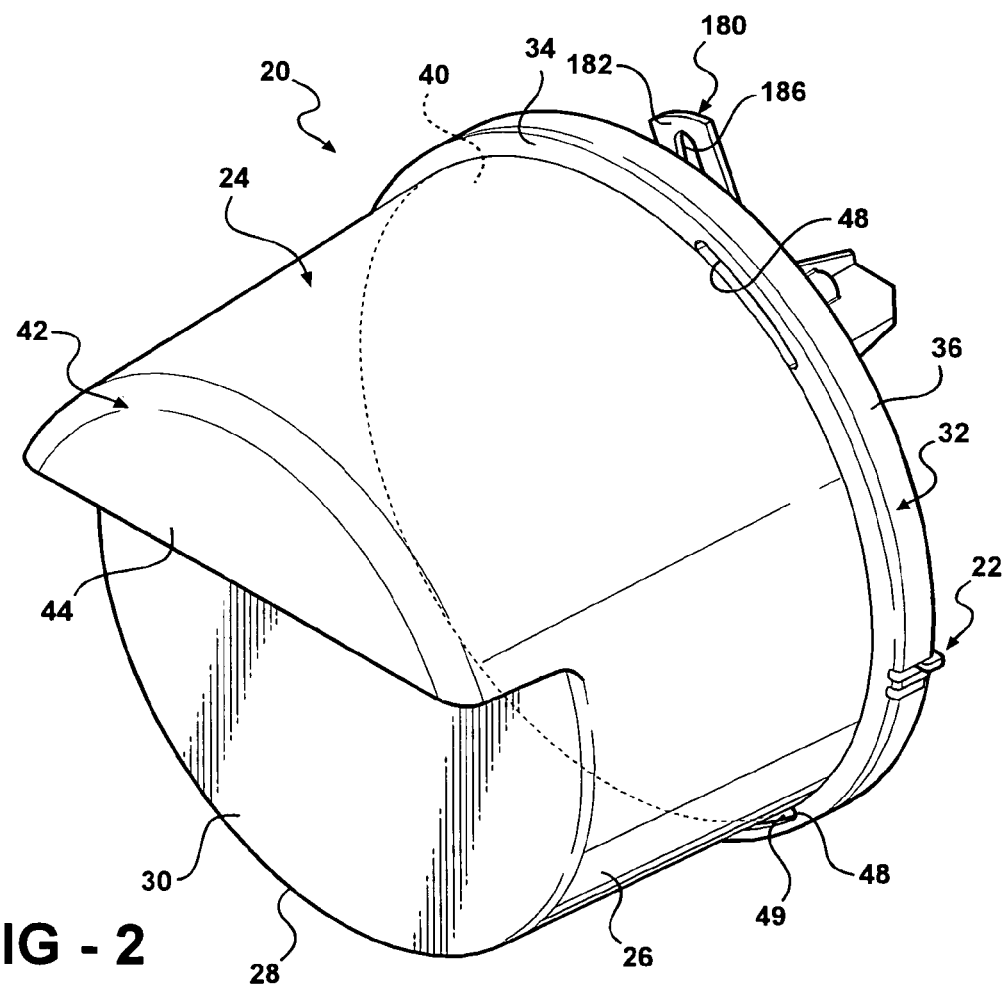
FIG. 2 is a perspective view of a watthour meter incorporating the features of the present invention.
Figure 3:
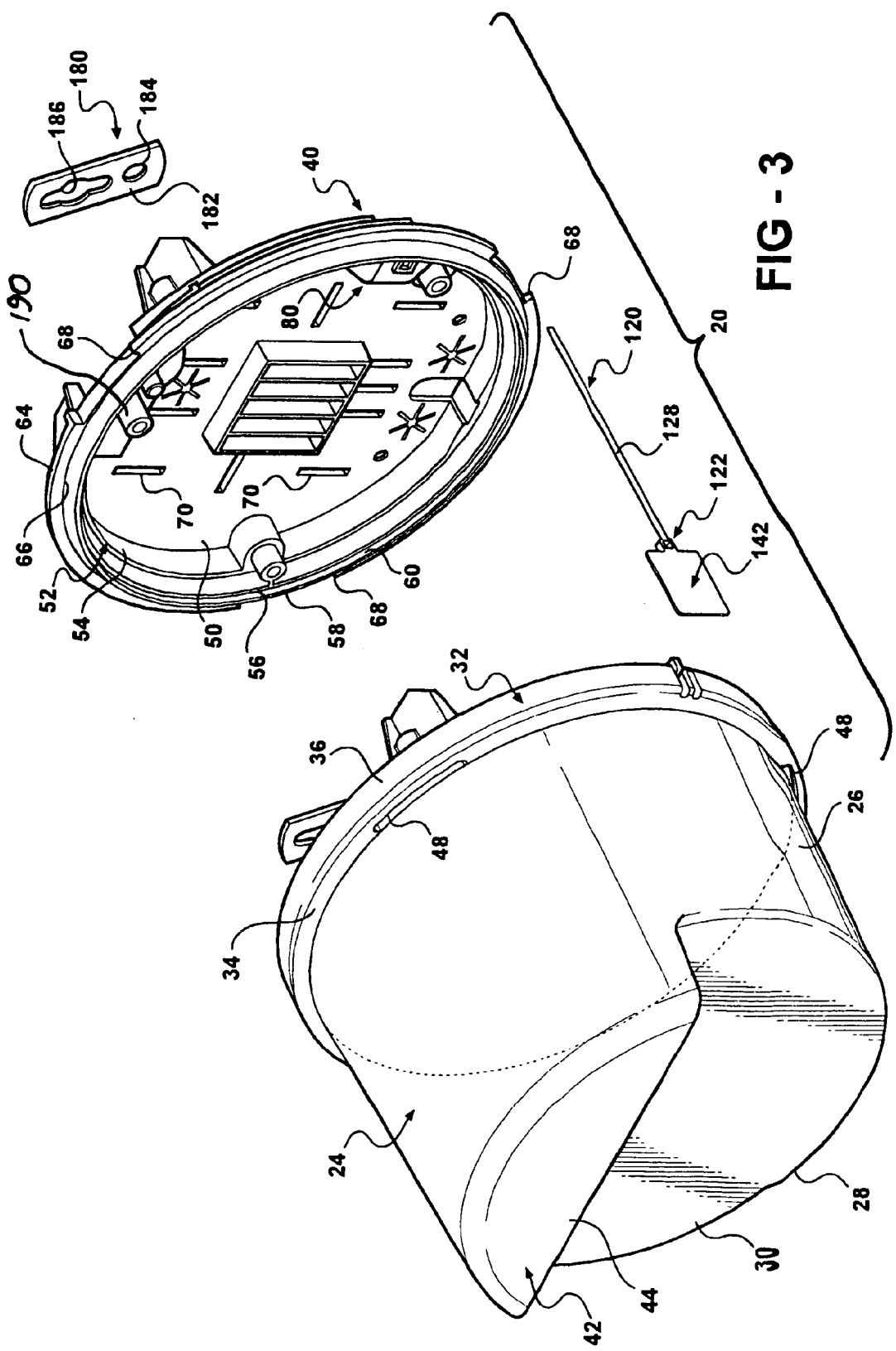
FIG. 3 is an exploded perspective view of the watthour meter shown in FIG. 1.

As is also shown by example only in FIGS. 2 and 3, the meter dome 24 is provided with a handle 42 which may be integrally formed with side wall 26. The handle 42, which can take a variety of shapes, is shown to be in the form of a outwardly extending lip projecting over a predetermined angular extent of the sidewall 26 and having an end 44 spaced from the end wall 30. The handle 42 provides a convenient gripping surface to assist in installing and removing the entire watthour meter 20 into and from a meter socket.

Returning to the end 32 of the meter dome 24, as shown in FIGS. 2 and 3, at least one and preferably a plurality of circumferentially spaced apertures, typically in the form of slots 48, are formed through the ledge 34 and open inside of the inner surface of the rim 36. An arm 49 is formed on the inner surface of the rim 36 and projects in a space manner under each aperture or slot 48. The arm 49 cooperates with a mating flange on the base 40 to rotatably join the cover 24 to the base 40.

The base 40, shown in greater detail in FIGS. 3–10, includes a bottom wall 50. A annular side wall 52 extends from the periphery of the bottom wall 50. The side wall 52 is defined by an inner ledge 54, and a pair of radially spaced rings 56 and 58 which are spaced apart to define an annular groove 60. The groove 60 is capable of receiving a shield 62, shown in FIG. 14. The shield 62, which can be formed of an opaque or translucent flexible plastic, may have any length so as to be disposed within the side wall 26 of the cover 24 and block at least a portion of the metering components mounted on the base 40 from exterior view.

An annular flange 64 projects radially outward from the outer surface of the side wall 52 and is spaced from the outer ring 58 of the side wall 52 by an annular groove 66 which is designed for receiving a fluid seal, such as a resilient O-ring, not shown.

A plurality of circumferentially spaced discontinuities or notches 68 are formed in the flange 64. The discontinuities or notches 68 receive the arms 49 on the dome 24 when the second end 32 of the dome is axially aligned with and engaged with the base 40. A rotation or twisting movement supplied to either or both of the dome 24 in the base 40 causes the arms 49 to rotate underneath the flange 64 and axially fix the dome 24 to the base 40.

Figure 14:
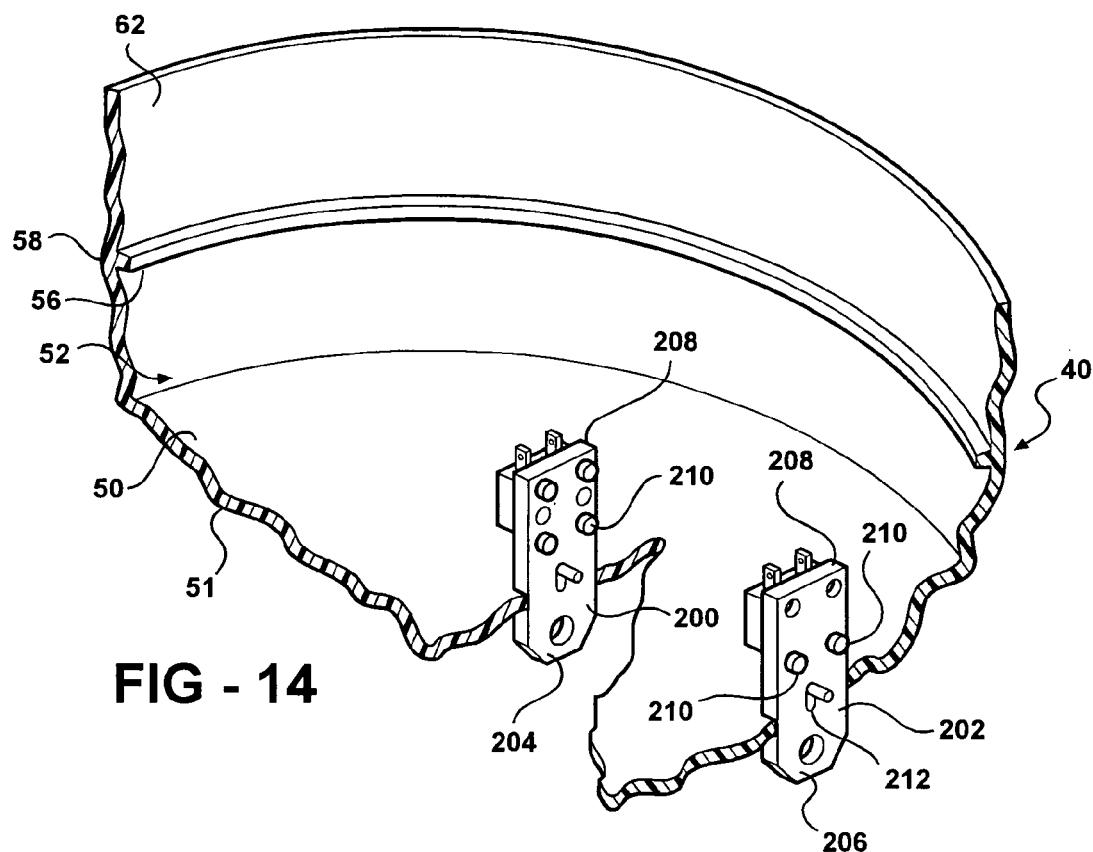
FIG. 14 is a partially broken away, partial, perspective view of the watthour meter base shown in FIG. 2, but carrying a tamper indicating means according to the present invention.
Figure 15:
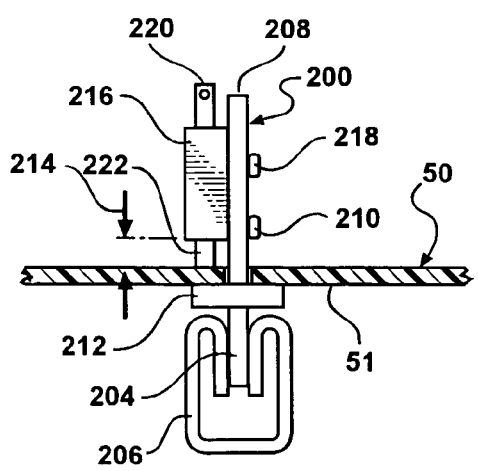
FIG. 15 is a cross-sectional view generally taken along line 15—15 in FIG. 14 and showing the position of the tamper detecting means in the normal mounting position of the watthour meter blade in a socket jaw contact.
Figure 16:
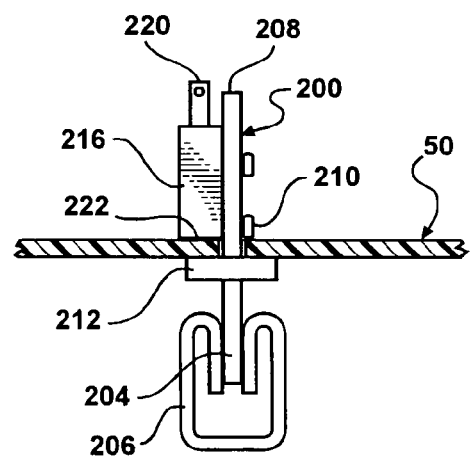
FIG. 16 is a view similar to FIG. 15, but showing the position of the tamper detecting means during the initial separation of the watthour meter blade from the socket jaw contact.

A plurality of slots 70 are formed in the bottom wall 50 of the base 40 for receiving meter blades as shown in FIGS. 14–16 and described hereafter. Other features on the base 40 are employed for connections to the metering components, not shown, which are normally mounted on the base 40 and housed within the interior of the meter dome 24.

Figure 4:
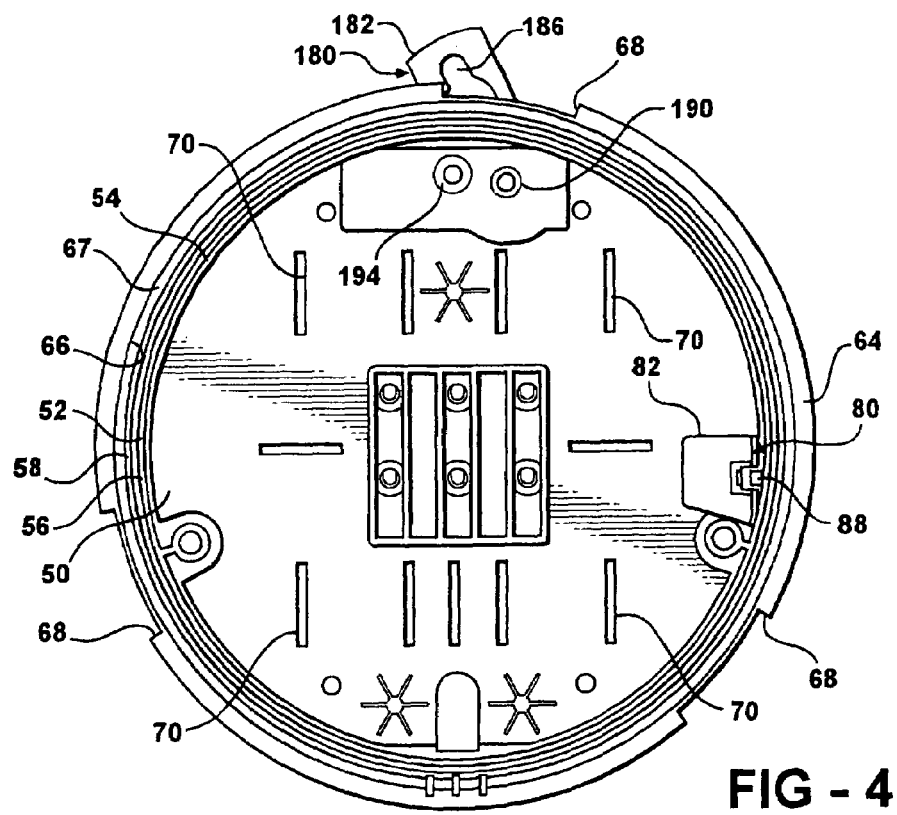
FIG. 4 is a front elevational view of the base of the watthour meter shown in FIGS. 2 and 3.
Figure 5:
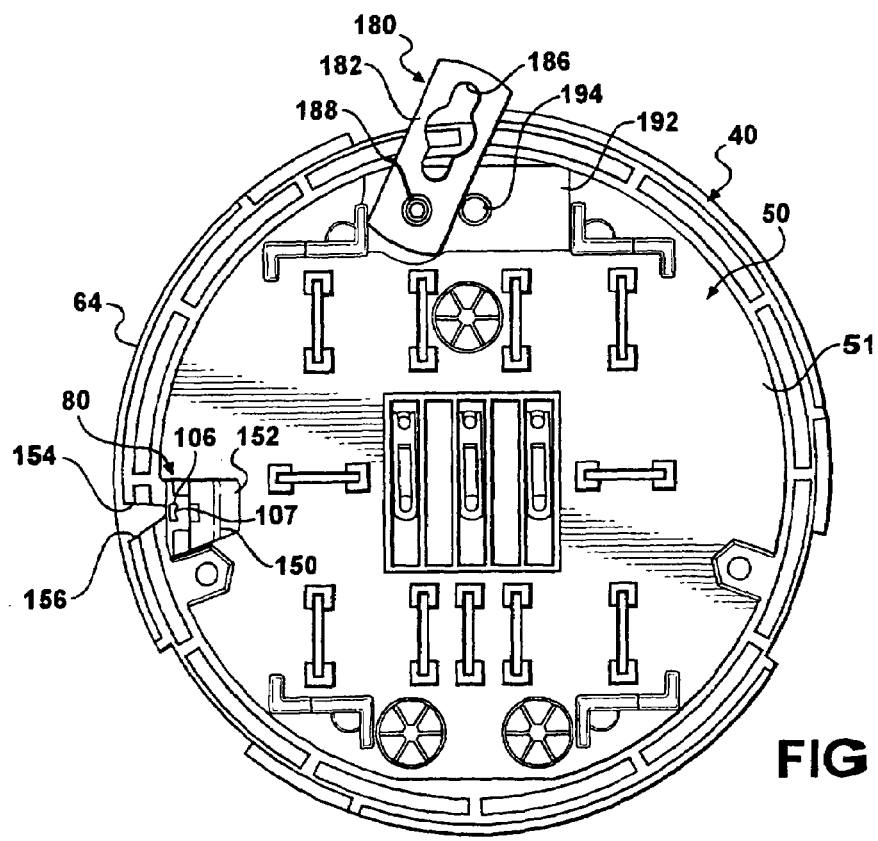
FIG. 5 is a rear elevational view of the watthour meter base shown in FIG. 4.
Figure 6:
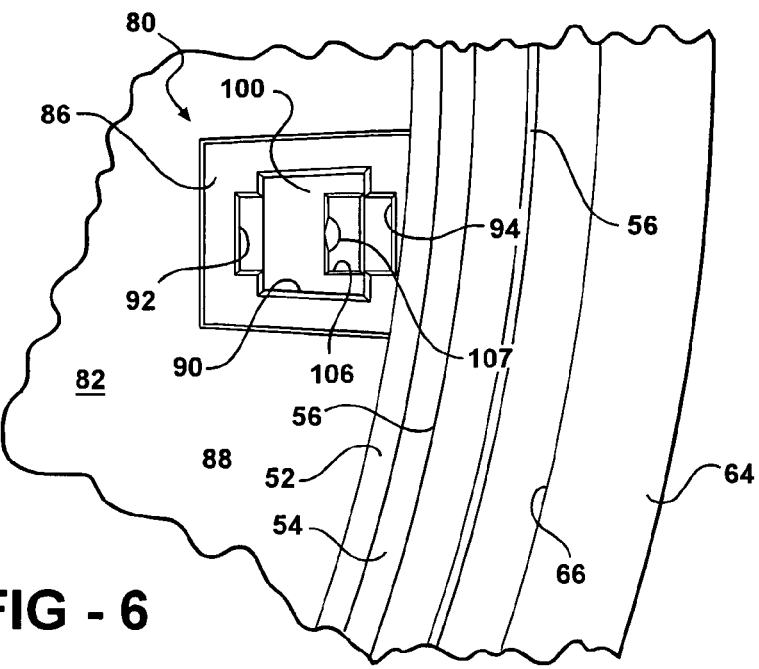
FIG. 6 is an enlarged, partial, plan view of the seal receiver on the base as shown in FIG. 4.

As shown in FIGS. 3, 4 and 5, and in greater detail in FIGS. 6–13, the watthour meter 20 includes a receiver means 80. The receiver means 80 includes a boss 82 which is disposed on the bottom wall 50 of the base 40. The boss 82 is in the form of an enlarged block, which is mostly solid, such as would result from an integral, one piece molding with the base 40. A seal receptacle 84 is formed in the block 82 adjacent to one end of the block 82 which is adjacent to the inner ring 56 of the side wall 52.

The seal receptacle 84 has an outer lip 86 which surrounds an irregularly shaped open-ended cavity 88. The cavity 88 extends through the lip 86 and a substantial distance into the block 82.

The cavity 88 includes an enlarged central bore 90 and opposed, smaller dimensioned ends 92 and 94. The ends 92 and 94 extend from an open end on the upper surface of the lip 86 to inner ends 96 and 98, respectively, which are disposed above a bottom wall 100 defining the bottom of the central bore 90 of the cavity 88.

Figure 8:
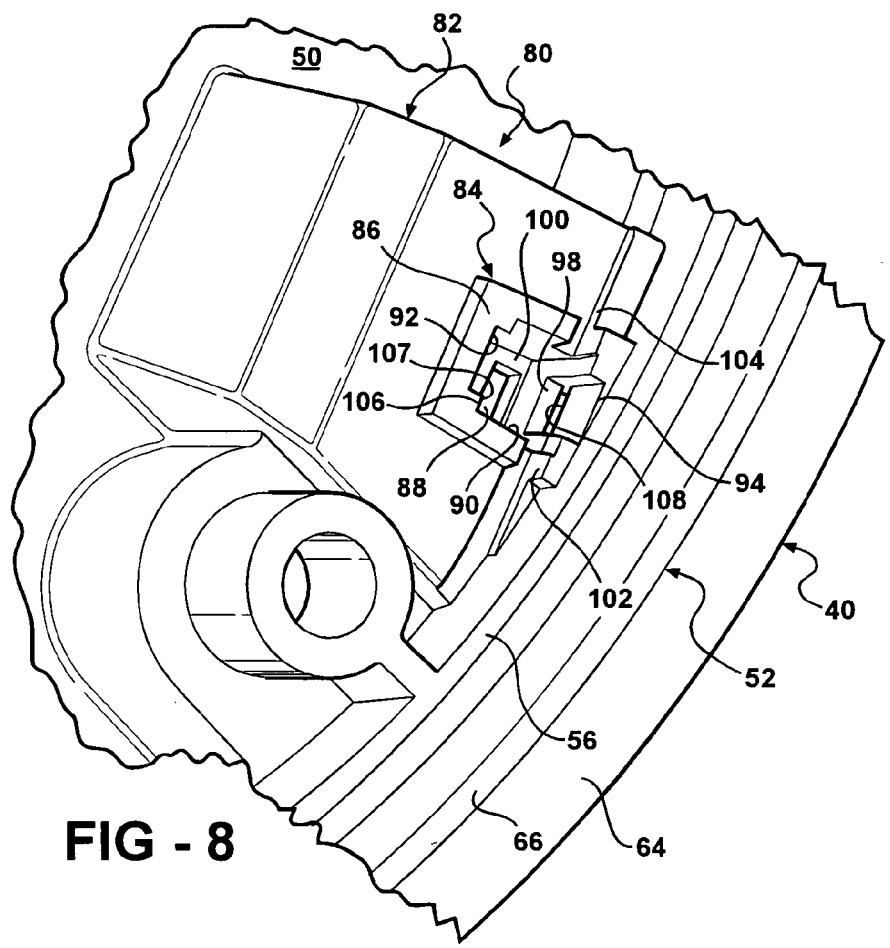
FIG. 8 is a partial, enlarged, perspective view of the seal receiver shown in FIGS. 6 and 7.
Figure 9:
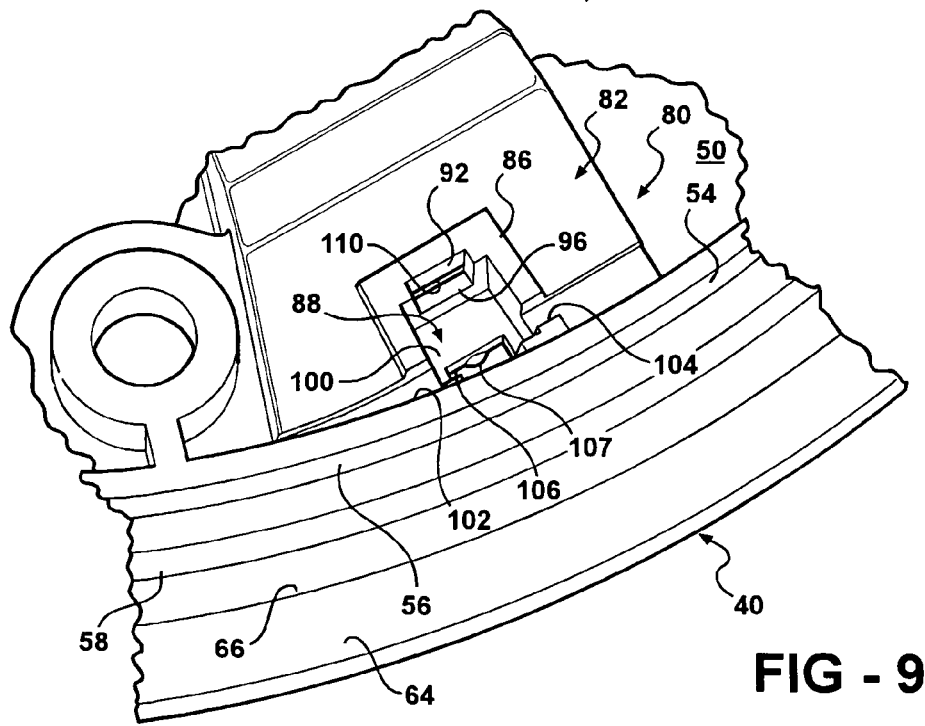
FIG. 9 is a different angle perspective view of the seal receiver shown in FIGS. 6 and 7.
Figure 10:
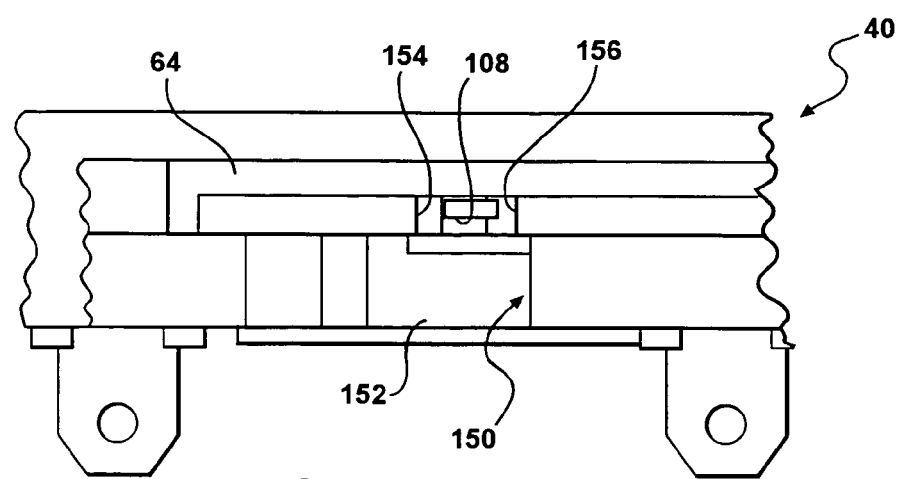
FIG. 10 is a partial side-elevational view of the meter base shown in FIG. 2.

As shown in FIGS. 8 and 9, notches 102 and 104 are formed in opposed sides of the lip 86 adjacent to the notch 94.

A first aperture 106 is formed in the bottom wall 100. A second aperture 108 is formed in one wall of the notch 94. A third aperture 110 is formed in one wall of the notch 92. The apertures 108 and 110 are laterally aligned.

A projection 107 is formed in the bottom wall 100 and is shaped as a wedge tapering outward into the first aperture 106 from the top surface to the bottom surface in the orientation shown in FIG. 9. The projection 107 wedges against a flexible tie inserted into the aperture 106 to hold the tie in an interference fit in the aperture 106, as described hereafter.

Figure 11:
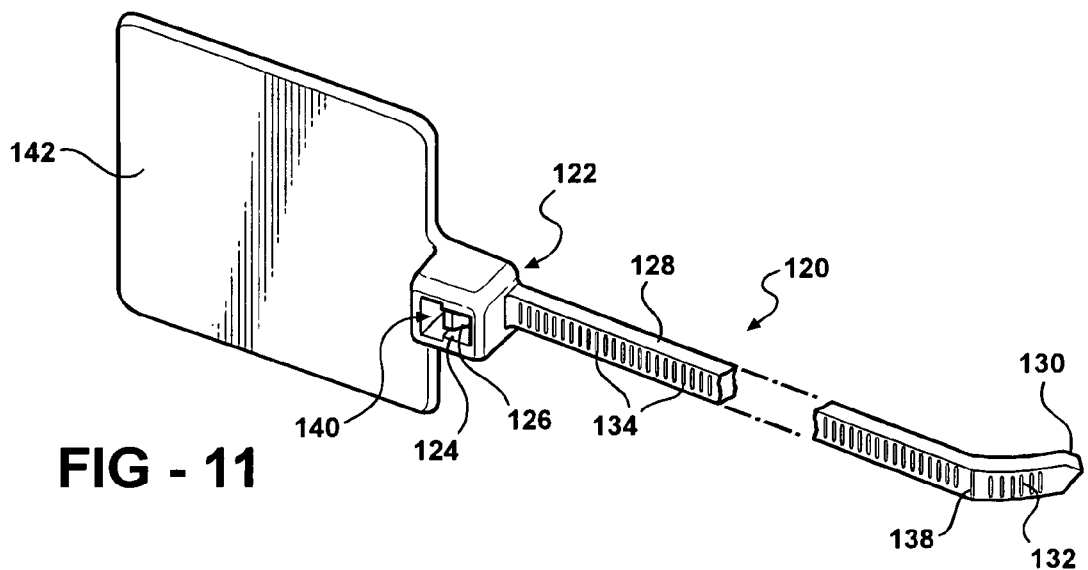
FIG. 11 is an enlarged, perspective view of the seal of the present invention.

The seal receiver cavity 88 is configured for releasably receiving a seal means, such as a flexible tie 120, as shown in detail in FIG. 11. The flexible tie, which is also known as a cable or wire tie and is sold by Panduit Corp., is formed with a locking head 122 having a through-bore or throat 124 in which is mounted a locking pawl 126. A strap 128 extends integrally from the head 122 and terminates in an end 130. One or more gripping projections 132 may be formed adjacent to the end 130 on one side or surface of the strap 128. A plurality of teeth 134 disposed at a close spacing extend from the head 122 for a substantial predetermined distance along the length of the strap 128 on an opposite side or surface of the strap 128.

A bend 138 may be formed in the strap 128 spaced from the end 130 to facilitate wrapping of the strap 128 in a loop so as to enable the end 130 to be inserted through an inlet end of the throat 124 in the head 122 and be forced through the throat 124 through an outlet end 140. The teeth 134 engage the pawl 126 to prevent a reverse movement or pullout of the strap 128 from the head 122. In this manner, the strap 128 is locked in a loop as described hereafter.

An optional tab 142 can also be integrally formed on and extending from the head 122 in a direction opposite from the direction of extension of the strap 128. The tab 142 facilitates installation and handling of the tie 120 as well as providing a convenient writing or label surface for indicating the date of installation of the seal, the installer or other information, etc.

Figure 7:
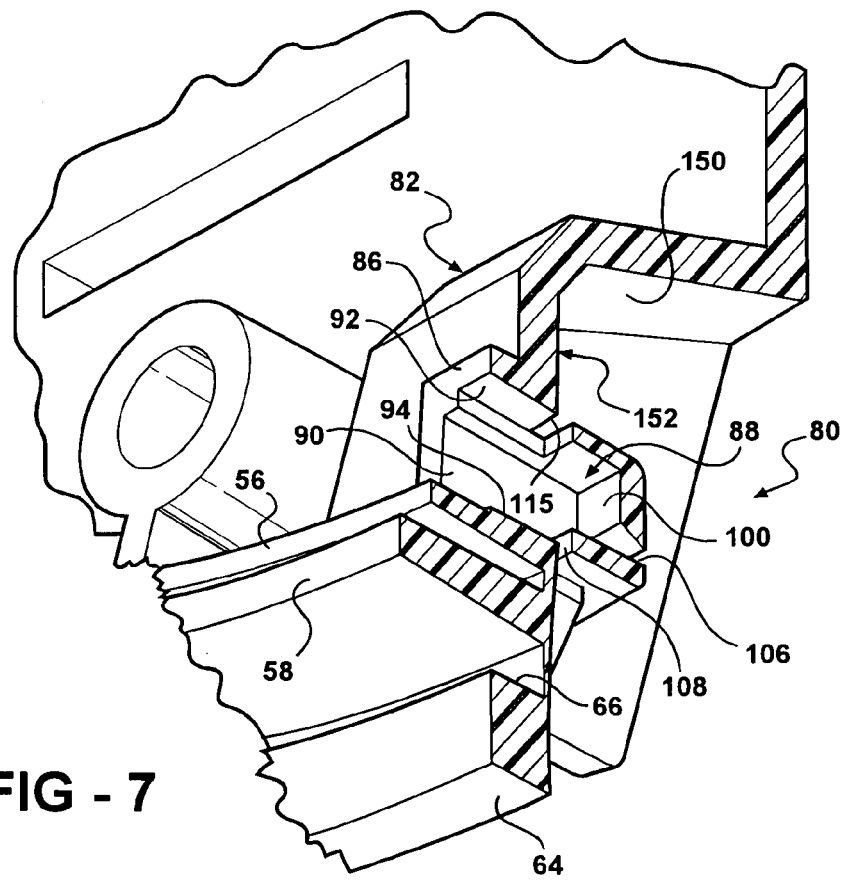
FIG. 7 is a perspective, cross-sectional view generally taken along the line 7—7 in FIG. 6.

As shown in FIGS. 5 and 7, the back surface 51 of the bottom wall 50 of the base 40 is formed with a pocket 150 below the boss 82. The pocket 150 includes an inclined or angled end wall 152, the purpose of which will become more apparent hereafter.

A guide way having opposed inward tapering sidewalls 154 and 156 is formed in the flange 64 on the back surface 51 on the bottom wall 50 on the base 40 to guide the end 130 of the seal 120 into the aperture 108, through the notch 94 in the block 82, through the head 122 of the seal 120 disposed in the cavity 88, as described hereafter, and then through the aperture 110 in the opposed notch 92. The end 130, on continued insertion through the head 122, contacts the inclined or angled end wall 152 of the pocket 150 and is urged away from the back surface 51. The end 130 may then be grasped to pull the seal 120 in a tight loop around the mating edges of the dome 24 and the base 40 to seal the dome 24 and base 40 together against rotational movement and to provide an indication of an attempted separation of the dome 24 from the base 40 when the seal 120 is broken, severed or removed from the meter 20

Figure 12:
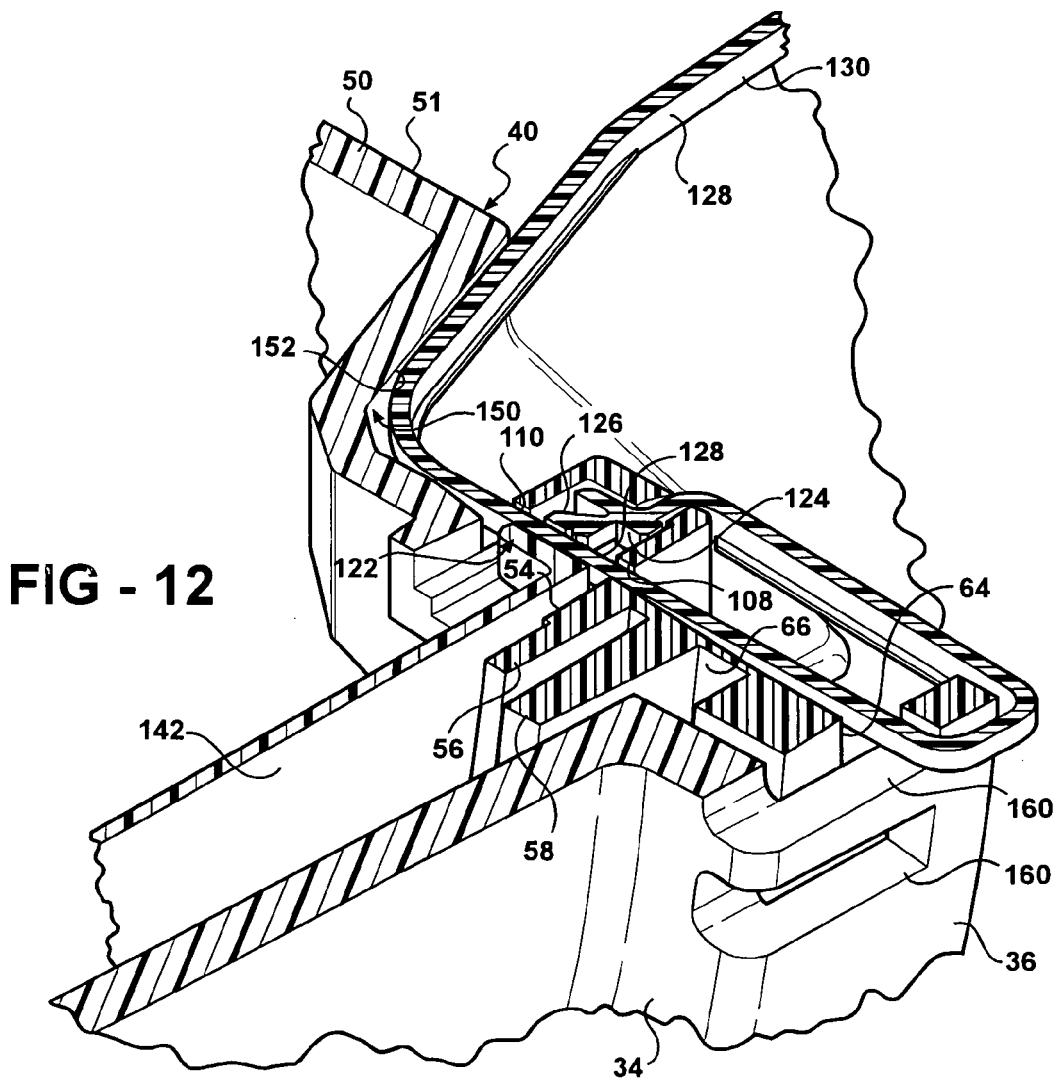
FIG. 12 is a partial, cross-sectional view showing the mounting of the seal in the watthour meter base and meter dome/cover.

As shown in FIG. 12, the end 130 of the seal 120 is first inserted into the cavity 88 and the block 84 and through the aperture 106 and the bottom wall 100 of the block 84 until the head 122 seats within enlarged center portion 90 of the cavity 88, with the main portion of the head 122 facing radially inward from the side wall 50 to the base 40. In this position, the throat 124 in the head 122 is aligned with the apertures 108 and 110 for passage of the seal 120 therethrough. The projection 107 wedges against the strap 128 of the tie 120 to retain the tie 120 in the cavity 88. Further, in this mounting position, the lower edges of the tab 142 of the seal 120 seat in the notches 102 and 104 formed in the block 84.

Figure 13:
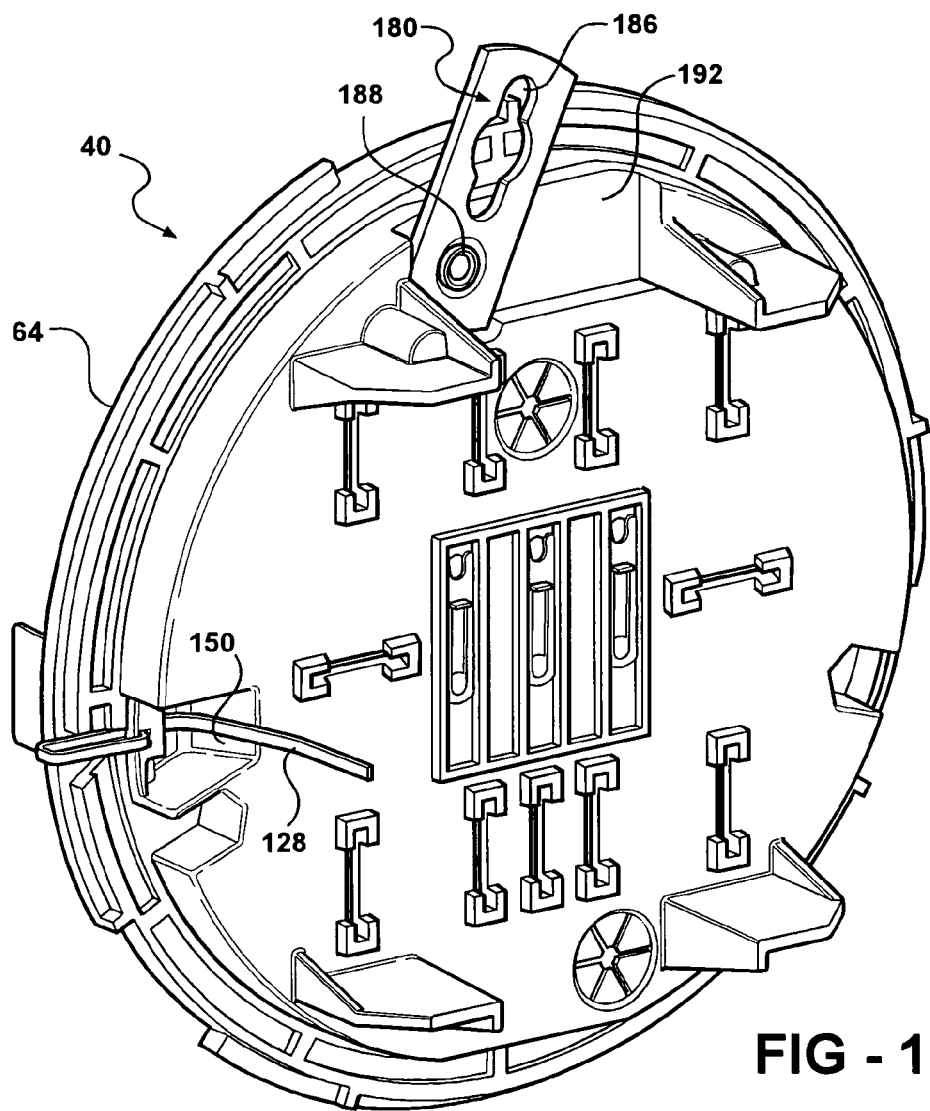
FIG. 13 is a perspective view of the base also showing the mounting of the wire seal of the present invention thereon.

As shown in FIGS. 12 and 13, prior to mounting of the dome 24 to the base 40, the seal 120 is inserted into the receiver 80 as described above. The end 130 of the seal 120 is left extending from the back surface 51 of the bottom wall 50 of the base 40. The dome 24 is then locked to the base 40 by alignment of the slots 48 and fingers 49 with a corresponding notches 68 and the flange 64 of the base 40. After engagement of the flange 32 of the dome 24 with the flange 64 of the base 40, rotational movement is imparted to one or both of the dome 24 of the base 40 to rotatably offset the base 40 from the cover 24. This slides the fingers 49 below the adjacent solid portions of the flange 64 to axially lock the cover 24 and base 40 together to prevent axial separation unless one of the cover 24 of the base 40 is rotated to bring the fingers 49 back into alignment with the notches 68 in the flange 64 of the base 40.

After the dome 24 and base 40 have been locked together, the end 130 of the seal 120 is looped around and through the apertures in the base 40 and the head 122. The end of the strap 128 of the seal 120 extend below the back surface of the base 50 and may be cut off to avoid interference with adjacent portions of the meter socket in which the meter 20 will be mounted.

Another feature of the inventive watthour meter 20 is a unique mounting connection of a hanger 180 used to temporarily mount the watthour meter 20 in a vertical orientation prior to installation in a meter socket.

The hanger 180 is in the form of a strap 182, typically of metal, and having generally circular aperture 184 adjacent one end and a keyhole shaped aperture 186 adjacent an opposite end.

A fastener 188, such as a threaded bolt or a pop rivet, is passed through the aperture 184 in the hanger 180 and into a post 190 projecting inward from a platform 192 on the front surface of the bottom wall 50 of the base 40. The post 190 may be internally threaded or the fastener 188 may be a self-tapping fastener to enable the fastener 188 to be threadingly coupled to the post 190.

The post 190 has a closed exterior so as to completely enclose all the fastener 188. This electrically insulates the fastener from the internal components of the meter 20.

A smooth portion on the shank of the fastener 188 allows pivotal movement of the strap 182 between a watthour meter use position wherein the strap 182 completely overlays the platform 192 and a pivotally extended position shown in FIGS. 2, 4 and 5, in which the strap 182 extends at an acute angle with respect to the platform 192. A stop 194 may also be formed as a projection on the platform 192 to act as a stop to angularly position the strap 182 in the desired position to enable the end of the slot 186 to be disposed along a vertically extending center line through the base 40 to enable temporarily mounting of the base 40 of the meter 20 on a hook, not shown. The stop 194 also engages the aperture 186 when the hanger 182 is pivoted to an overlaying position on the platform 192 to secure the hanger 182 in this position during installation, use or movement of the meter.

Another aspect of a watthour meter is shown in FIGS. 14–17. A plurality of blades, with two blades 200 and 202 being shown by way of example only, are mounted in the bottom wall 50 of the base 40. Each blade has a first end portion 204 extending from the bottom surface 51 of the base 50 and adapted for engagement with a meter socket jaw contact 206, shown in FIGS. 15 and 16, which is fixedly mounted in a meter socket, not shown. Each blade 202 also includes an opposed end portion 208 which projects into the interior of the base 50 above a front surface of the base 50. The end portion 208 of each blade 200 and 202 contains apertures for connection to the metering components mounted on the base 40.

Each blade, such as blade 202, is fixedly mounted in the bottom wall 50 of the base 40 by a pair of projections or dimples 210 formed in the blade 202 intermediately between the opposed ends 206 and 208 and a fastener, such as a cotter pin 212 which is extendable through another aperture in the blade 202 spaced a predetermined distance from the dimples 210 so as to trap the bottom wall 50 of the base 40 securely between the pin 212 and the dimples 210 without movement of the blade 202.

A tamper detection and indicating means is provided to detect and indicate unauthorized tampering with the meter 20 as defined by an unauthorized separation of the meter 20 from the jaw contacts 206 in the meter socket.

The tamper detection means includes at least one moveable blade, such as the blade 200, which is reciprocally moveably mounted in one of the slots 70 in the base 40. The moveable mounting of the blade 200 can be effected in a number of ways. In one instance, the spacing between the dimples 210 and the cotter pin 212 can be increased by a slight amount, as shown in FIG. 15, to permit movement of the blade 200 over a distance 214 shown in FIG. 15.

Figure 17:
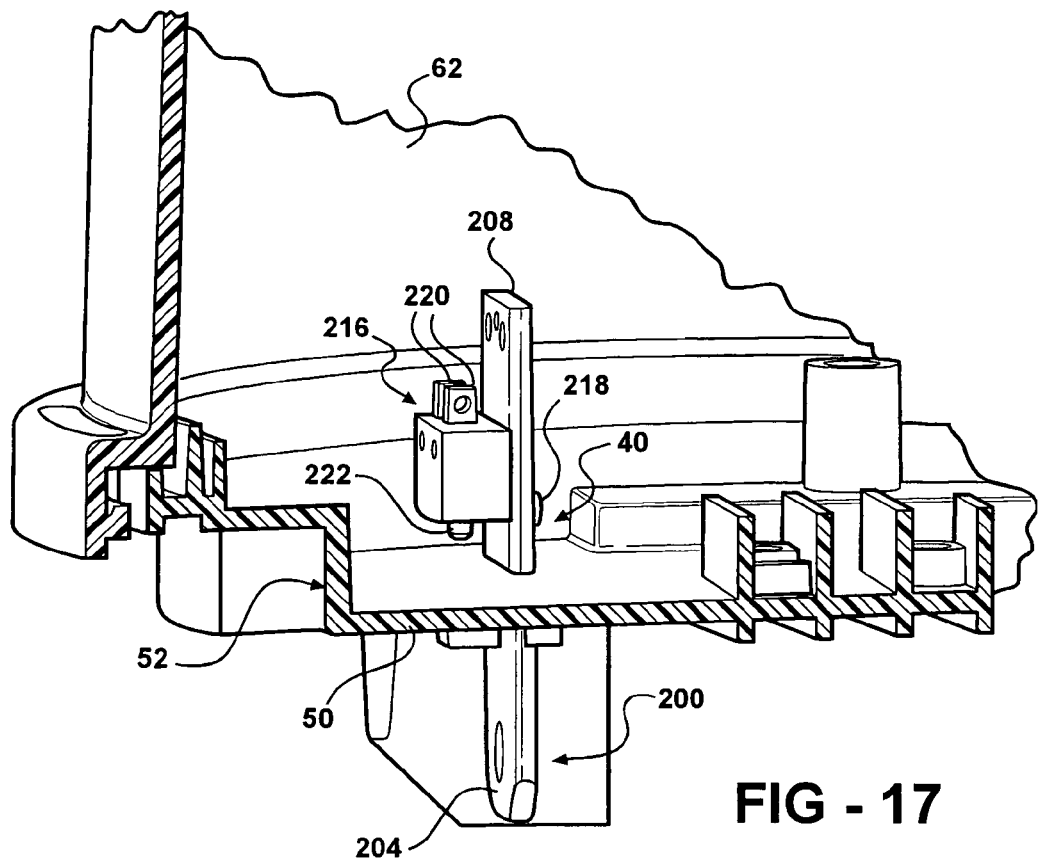
FIG. 17 is a partial perspective view of the tamper detecting means shown in FIGS. 14–16.

Another mounting configuration can eliminate the dimples but adds a movement detector, such as a microswitch 216 seen in FIGS. 15 and 17. The microswitch 216 is mounted to the blade 200 by fasteners 218, for example. The microswitch 216 has at least one and on a plurality of terminals 220 projecting from one end for connection by wires to signal responsive components mounted within the watthour meter 20, such as a relay, an automatic meter reading circuit, etc.

A moveable plunger 222 extends from the body of the microswitch 216 and is normally disposed in contact or slightly spaced from the bottom wall 50, but in a non-activated or depressed state as shown in FIG. 15 in the normal mounting position of the meter 20 in the meter socket. In this position, the cotter pins 212 is disposed in substantial registry with the bottom surface 51 of the base 40 so as to prevent any movement of the blade 200 in a direction out of the jaw contact 206 separate from movement of the base 40. A biasing means disposed internally within the body of the switch 216 to normally bias the plunger 222 outward to a pressure responsive state, is also sufficient to bias the blade 200 in the desired normal mounting position shown in FIGS. 14 and 15.

It should be noted that during insertion of the meter 20 into this meter socket, the end 204 of the blade 200 will initially contact the outer edges of the socket jaw contact 206. This will force the cotter pins 212 into engagement with the bottom surface 51 of the base 40 to provide a rigid, non-moveable blade 200 structure for further insertion of the end 204 toward the blade 200 into the socket jaw contact 206.

When the meter 20 is separated from the meter socket, as shown in FIG. 16, the initial separating movement of the base 40 of the meter 20 relative to the socket jaw contact 206 is possible over the distance 214. However, the blade 200 is held captive in the jaw contact 206 and does not initially move with initial movements of the base 40. However, this initial movement of the base 40 depresses the plunger 222 of the switch 216 since the switch 216 remains fixed in position on the blade 200. The plunger 222 switches an internal contact within the switch 216 and provides an output signal on the terminals 220. This output signal on the terminals 220, which is an indication of separating movement of the base 40 of the meter 20 relative to the meter socket can be conveyed, to a relay on the base 40 for internal or external activation of a light, audible alarm or other tamper event detection indicating means as well as by a direct signal or via a relay or other signal conditioning element, as an input to an automatic meter reading device mounted within the meter 20 to likewise activate a visible and/or audible light or alarm shown in FIG. 26 in the meter 20 and to convey a remote signal to the utility company of the detection of a tampering event.

Another aspect of a tamper detecting means employed in a watthour meter or electrical service apparatus is shown in FIGS. 18–26. In this aspect, the meter 20 can have the same dome 24 and base 40 construction described above and shown in F*ig*. 1.

As shown in FIGS. 18–20 and 22–25, the bottom wall 50 of the base 40 is positioned between an upturned, annular sidewall 230. The upper end of the sidewall 230 transitions into a radially outward extending ledge 232. A slot or bore 234 which can be disposed at a non-perpendicular angle with respect to the radial extent of the ledge 232, extends through the ledge 232 from a first end on the radially outer surface 236 of the ledge 232 to an inner end opening to the interior of the base 40. The bore 234 may taper outwardly in increasing width from the first end to the second inner end.

Figure 18:
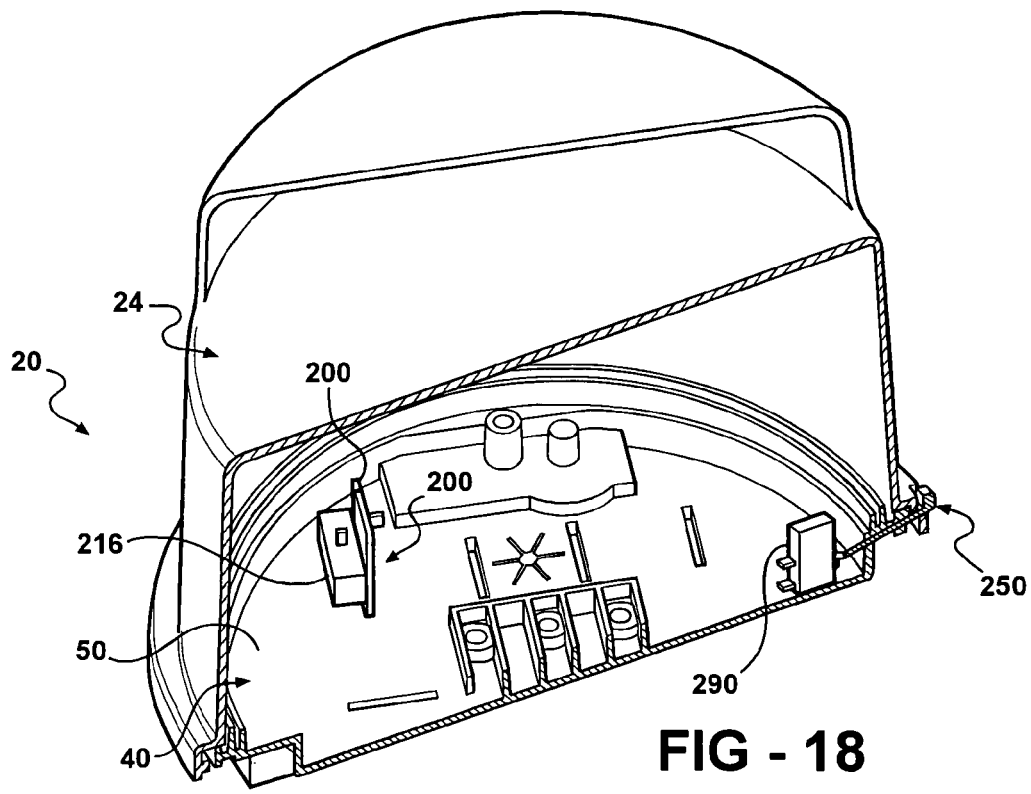
FIG. 18 is a broken away, perspective view of another aspect of a tamper detecting means.
Figure 20:
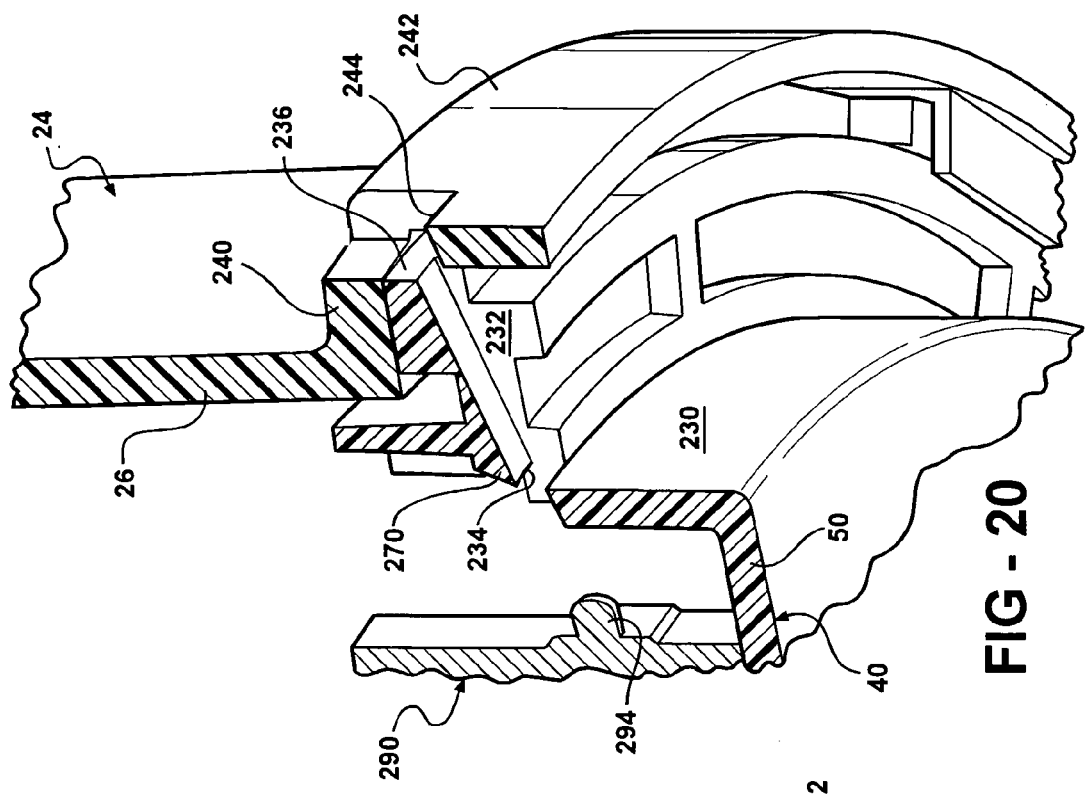
FIG. 20 is an enlarged perspective view of the base to cover interconnection shown in FIG. 19.
Figure 19:
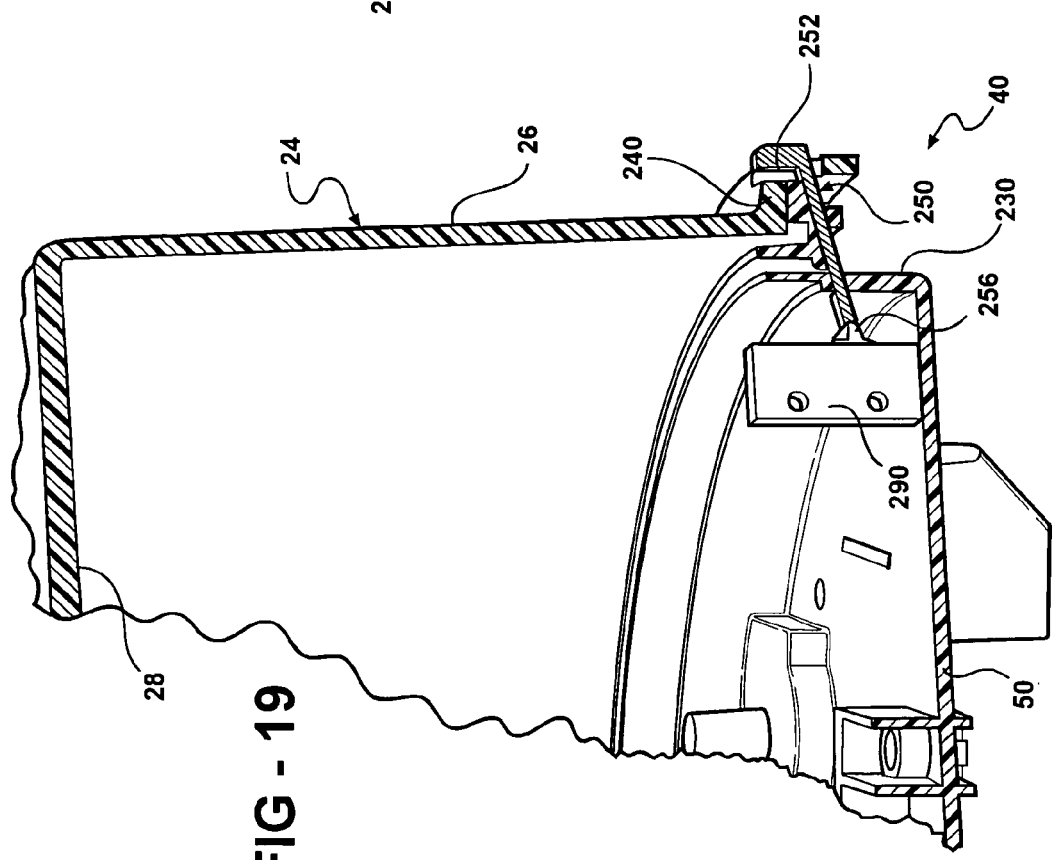
FIG. 19 is an enlarged perspective view of the tamper detecting means shown in FIG. 18.

As described above, the sidewall 26 of the dome or cover 24 also transitions into a radially outward extending ledge 240. The outer edge of the ledge 240 transitions into an axially depending rim 242 which overlays the outer surface 236 of the ledge 232 of the base 40 when the dome 24 is mounted on the base 40 as shown in FIGS. 18–20.

An aperture 244 is formed in one or both of the ledge 240 and the rim 242 of the dome 24 and opens to one end of the bore 234 in the base 232. The aperture 244 provides access to the bore 234 for insertion of a connecting or seal means, such as a connecting pin 250 shown in FIGS. 19, 21, 22, 23, 24, and 25.

The connecting means, hereafter referred to as a connecting pin 250, is formed of a high strength material which resists bending or breakage. For example, the connecting pin 250 may be formed of a metal, such as steal, brass, etc.

Figure 21:
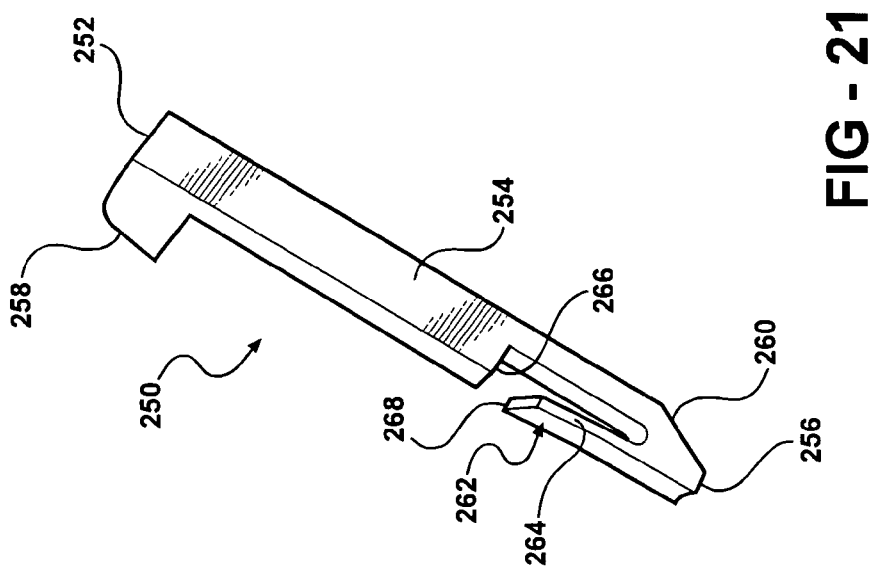
FIG. 21 is an enlarged, perspective view of the connecting pin shown in FIGS. 18 and 19.
Figure 23:
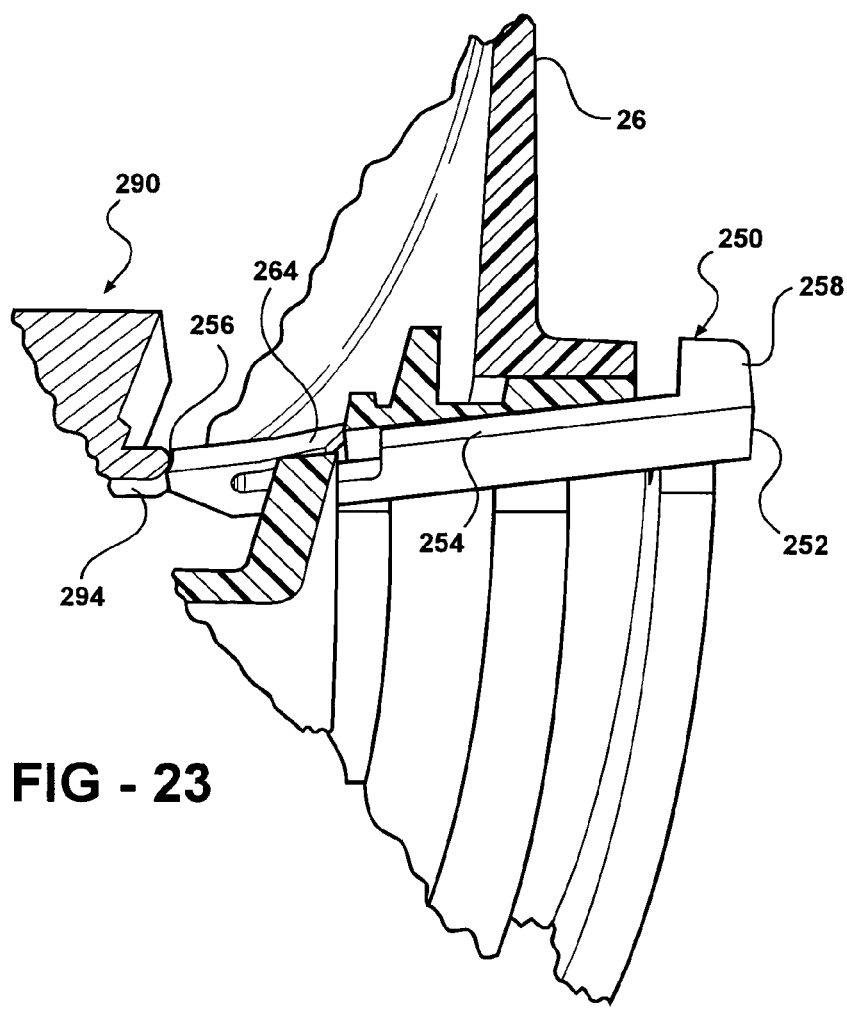
FIG. 23 is a bottom perspective view of the connecting pin to base connection shown in FIG. 22.
Figure 24:
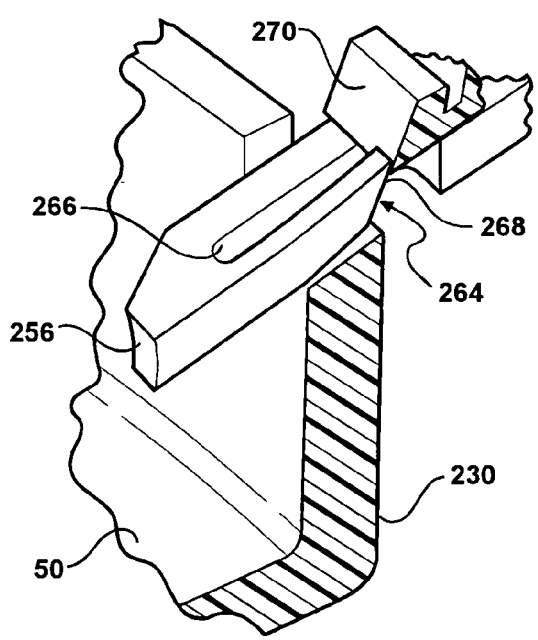
FIG. 24 is an enlarged, perspective view showing the latched engagement of the connecting pin with the meter base.

As shown in detail in FIG. 21, the connecting pin 250 may be formed of a one-piece, integrally cast or machined body having a first end 252, a shank 254, and the opposed second end 256. A flange 258 projects angularly from the stem 254 at the first end 252. The second end 256 may have a tapered edge 260, by example only.

A latch means 262 is carried by the connecting pin 250. The latch means 262 may be integrally cast or machined in the connecting pin 250, such as in the stem 254 at an intermediate position between the first and second ends 252 and 256.

Figure 22:
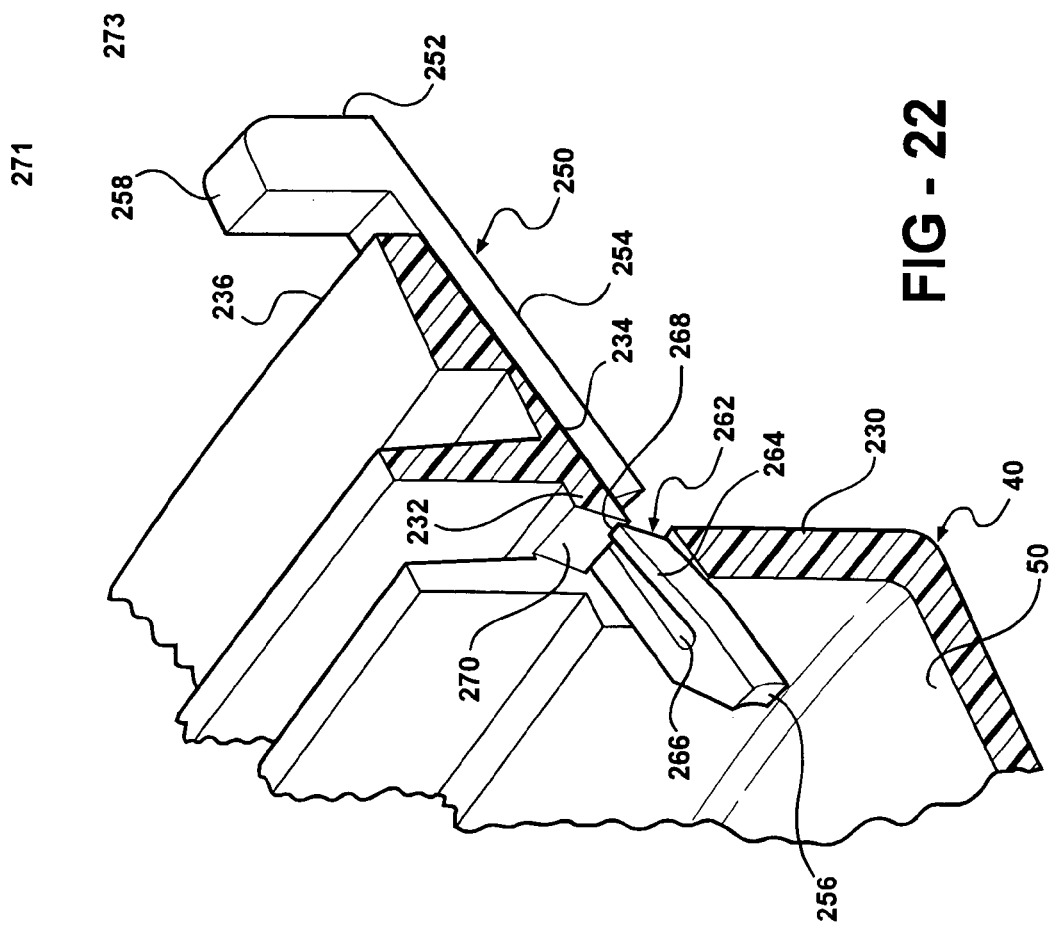
FIG. 22 is an enlarged, partial, perspective view showing the mounting of the connecting pin to the base.

The latch means 262 may be in the form of a bendable latch arm 264 which extends over a cut-out or recess 266 in the stem 254. The latch-arm 264 is bent under a pre-load force to extend angularly from the plane of the stem 254 as shown in FIG. 22. The latch-arm 264 terminates in a tip-end 268. The inner edge 268 of the latch-arm 262 can be tapered or disposed at a non-perpendicular angle relative to the longitudinal axis of the latch-arm 262.

In assembling this aspect of the meter 20, the dome or cover 24 is mounted on the base 40 in the orientation shown in FIG. 19. In this position, the aperture 244 in the dome 24 is aligned with one end of the bore 234 extending through the ledge 232 on the base 40 as shown in FIGS. 19 and 20. The second end 256 of the connecting pin 250 is then inserted through the aperture 244 in the dome 24 and the bore 234 in the ledge 232 of the base 40 until the tip end of 268 of the latch-arm 264 passes an inner edge 270 of the ledge 234 on the base 40. During such insertion, the latch arm 264 is bent into the plane of the stem 254 until the tip end 268 clears the surface 270 of the ledge 232. At this time, the latch arm 264 snaps back to its normal, angular position with respect to the stem 254 bringing the tip end 268 into latching engagement with the inner surface 270 of the ledge 232 of the base 40 thereby latching the connecting pin 250 between the cover 24 and the base 40 to rotatably fix the dome 24 on the base 40 while at the same time preventing rotation or separation of the dome 24 relative to the base 40.

Figure 25:
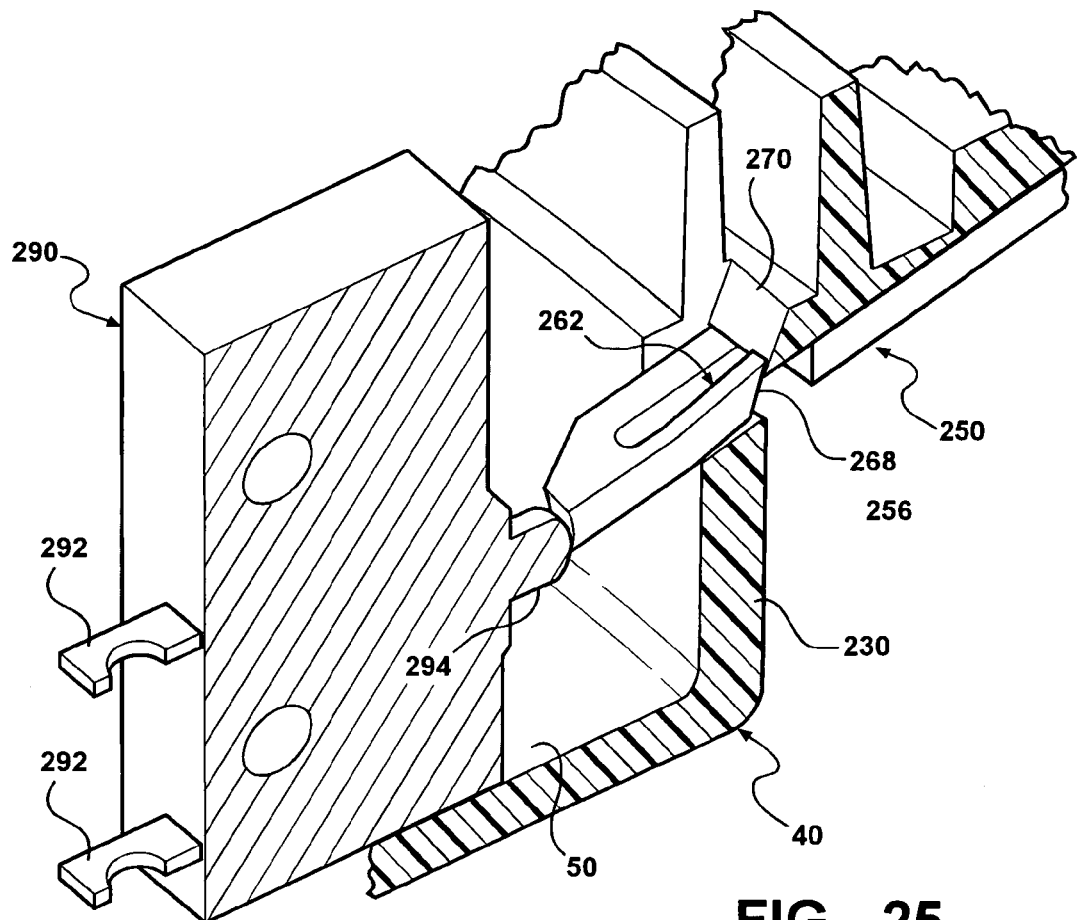
FIG. 25 is an enlarged, perspective view showing the engagement of the connecting pin to the tamper detection signal generating means.

With the watthour meter 20 mounted in a meter socket, not shown, when the socket cover 271 of a ringless socket, FIG. 22 is mounted over the dome to the socket housing, or a sealing ring 273 is mounted over the rim 244 and adjoining portions of the dome 24 and the ledge 232 of the base 40, the socket cover 271 or the sealing ring 273 will bias the first end 252 of the connecting or seal pin 250 toward the rim 236 moving the pin 250 further into the interior of the base 40. This biasing force urges the opposed second end 256 of the pin 250 into forced engagement with tamper event detection signaling device, such as a micro switch 290. The microswitch 290, which can be fixedly mounted on the bottom wall of the base 40, includes one or more terminals or output connections 292 which provide an electrical signal through a switchable contact 291, FIG. 26, within the interior of the microswitch 290. The state of the contact 290 is switched by a movable, spring biased plunger 294 having an end extending outward from the micro switch 290. The biased inward position of the connecting pin 250, as shown in FIG. 25, causes the second end 256 of the pin 250 to move the plunger 294 from a first, normal, outward most extending position to a depressed position relative to the housing of the microswitch 290. This places the internal contact in the micro-switch 290 in a first state, which can be opened or closed depending upon the signaling circuitry. This contact position could be used to indicate the normal mounting position of the cover or dome 24 on the base 40. However, any removal or separation of the cover 24 from the base 40, which will require breakage of the connecting pin 250, as described hereafter, or a predetermined amount of rotation of the cover 24 relative to the base 40, the tip end 268 of the connecting pin 250 to disengage from the inner surface 270 of the ledge 244 of the base 40. The internal biasing force exerted on the plunger 294 in the microswitch 290 will then cause the plunger 294 to move outward, pushing the connecting pin 250 radially outward sufficiently to cause the internal contact in the microswitch 290 to change states or positions to a second position indicative of a tampering event. The connecting pin 250 and the tamper event signaling device form a tamper detection and signaling means.

The bore 234 through the ledge 232 of the base 40, in addition to being angled relative to the bottom wall 50 of the base 40, may also be tapered from at an outer end of the ledge 234 to a wider cross-section at an inner edge of the wall 230 on the base 40. This enables rotational movement of the latch-arm 262 relative to the inner end 270 of the ledge 232 as described above.

The connecting pin 250 also resists separation of the dome 24 from the base 40. Removal of the dome 24 from the base 40 can be accomplished only by removing the entire meter 20 from the meter socket and then breaking the pin 250, such as by separating the outer lip or flange 258 from the stem 254. It will be noted that any separation of the meter 20 from the meter socket will also be detected by the tamper detection means.

Figure 26:
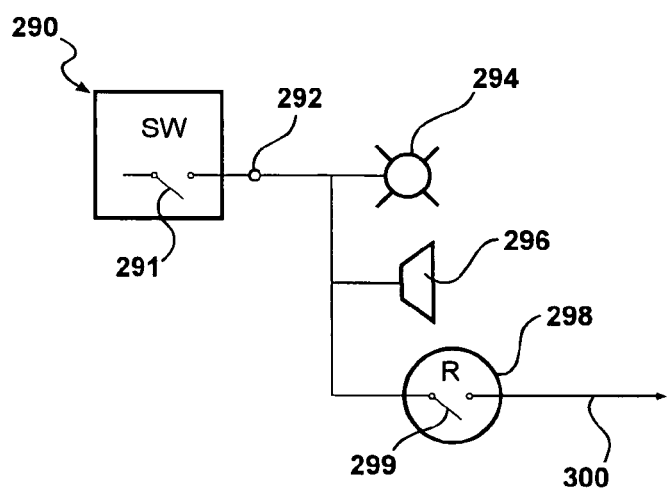
FIG. 26 is a pictorial representation of the tamper detect signals generated by the tamper signal generating means of FIG. 25.

The signal from the contact 291 in the microswitch 290 is output through the terminals 292 which may be connected, as shown in FIG. 26, to various tamper indicating devices. The terminals 292 may be connected through an intermediate relay, not shown, or directly to a visible tamper indicating means, such as an illuminatible lamp or LED 294, mounted on the meter 20 in a visible location or through an external conductor to an illuminatible means 294 in the meter socket. Alternately or concurrently, the output signals from the terminal 292 of the microswitch 290 may be connected to an audible alarm, such as a horn or siren 296, which again can be mounted on or in the meter 20 or in the meter socket.

The output signals from the microswitch 290 may also be connected via the terminals 292 to a relay 298 having an internal contact 299 which switches state when the relay 298 is activated by a signal from the microswitch 290. The signal 300 from the contact 299 can be conveyed remotely from the meter 20 and/or meter socket for a remote tamper indicating signal.

In summary, there has been disclosed a watthour meter having unique features not found in previous watthour meters. Such features include a unique tamper detection means using a moveably mounted meter blade and blade movement detector, an electrically insulated mounting of the temporary meter hanger, a flexible seal formed of an electrically insulating material to seal the meter cover and base while at the same time providing a tamper indicator of unauthorized separation of the meter cover from the meter base.

In another aspect, a connecting pin insertable through aligned openings in the base and the cover is latchable to the base to prevent rotation and/or separation of the cover from the base. The inner end of the pin is biased into engagement with a tamper detection and signaling means, such as a microswitch. The microswitch provides an indication of a tamper event when the connecting pin is disengaged from the plunger of the microswitch thereby enabling the internal contact of the microswitch to change state. This signal can be conveyed to one or more tamper indicating devices on the meter and/or meter socket, such as visual or audible signaling devices, including lamps, LEDs, horns, sirens, etc. The tamper detection signal from the micro-switch can also be conveyed as a remote signal to the utility company, etc., for remote indication of a tamper event occurring with a particular watthour meter.

What is claimed is:

1. A watthour meter comprising:
   a base;
   a dome coupled to the base;
   metering components mounted within the base and the dome; and
   tamper detection means for detecting tampering with the watthour meter, the tamper detecting means including a flexible tie having a strap engagable in a loop through apertures in the joined base and dome, the tie having a locking head for non-releasably receiving the strap.

2. The watthour meter of claim 1 wherein the receiver means comprises:
   a receptacle for receiving the locking head of the tie in a fixed position.

3. The watthour meter of claim 2 further comprising:
   a plurality of apertures formed in the receiver means, a first aperture alignable with a bore in the locking head of the tie for receiving the end of the strap of the tie.

4. The watthour meter of claim 3 further comprising:
   a second aperture aligned with the bore in the locking head for receiving the end of the tie after the tie has passed through the bore in the locking head.

5. The watthour meter of claim 4 further comprising:
   a second aperture opening to a pocket on an exterior surface of the base.

6. The watthour meter of claim 5 wherein the pocket comprises:
   a ramp surface for directing the end of the tie away from the base.

7. The watthour meter of claim 2 wherein the receiver means comprises:
   a third aperture for receiving the strap of the tie when the tie is mounted in the receptacle.

8. The watthour meter of claim 7 further comprising:
   a projection carried in the receiver means for engaging the strap to hold the tie in the receptacle.

9. The watthour meter of claim 1 further comprising:
   a hanger adapted for hanging the watthour meter prior to installation of the watthour in the meter socket;

a fastener mounted on the base and pivotally attaching the hanger to the base; and means, carried on the base, for fixedly receiving the fastener and electrically insulating the fastener from metering components mounted on the base.

10. A watthour meter comprising:

a base;

a dome coupled to the base;

metering components mounted within the base and the dome;

tamper detection means for detecting tampering with the watthour meter;

a hanger adapted for hanging the watthour meter prior to installation of the watthour in the meter socket;

a fastener mounted on the base and pivotally attaching the hanger to the base; and a post formed in the base and receiving the threaded fastener, the post having a closed exterior on a portion extending from the base for electrically insulating the fastener from metering components mounted on the base.

11. A watthour meter comprising:

a base;

a dome coupled to the base;

metering components mounted within the base and the dome; and tamper detection means for detecting tampering with the watthour meter, the tamper detection means including means for providing a recognizable indication of separation of the watthour meter from a meter socket jaw contact after the watthour meter has been connected to the jaw contact in the meter socket; the indication providing means including:

at least one blade adaptable to be connected to a meter socket jaw contact, the blade moveably carried in the base; and tamper signaling means, responsive to movement of the blade upon separation of the watthour meter from the meter socket jaw contact, for generating a tamper detect signal, the tamper signaling means including;

a switch having a moveable plunger, the switch fixed to the blade to position the plunger in proximity with the base to detect movement of the base relative to the blade; and a switchable contact in the switch responsive to plunger movement for providing a signal upon detection of movement of the blade relative to the base.

12. A watthour meter comprising:

a base;

a dome coupled to the base;

metering components mounted within the base and the dome; and tamper detection means for detecting tampering with the watthour meter, the tamperer detection means including:

aligned openings formed through the base and the dome, and having an end opening to an interior of the coupled base and dome;

a connecting pin mountable through the aligned openings and latched to at least one of the base and the dome, the connecting pin having an inner end; and tamper event signal generating means, mounted within the coupled base and dome, for generating a signal upon a change in position of the inner end of the pin.

13. The watthour meter of claim 12 wherein:

the opening extending through the base is wider at an inner end than at an opposed outer end.

14. The watthour meter of claim 13 wherein:

the openings extending through the base and the dome at disposed at a non-parallel angle relative to the base.

15. The watthour meter of claim 12 wherein the connecting pin comprises:

a stem; and latch means, carried on the stem, for latching the pin to one of the base and the dome.

16. The watthour meter of claim 15 wherein the latch means comprises:

a bendable arm carried on the stem.

17. A watthour meter comprising:

a base carrying metering components;

a cover coupled to the base;

a hanger adapted for hanging the watthour meter prior to installation of the watthour in the meter socket;

fastener means coupled to the base in a location for pivotally attaching the hanger to the base for pivotal movement between a storage position completely within a periphery of the base and a use position in which a portion of the hanger extends beyond the periphery of the base; and means, carried on the base, for fixedly receiving the fastener and electrically insulating the fastener from metering components mounted on the base.

18. A watthour meter comprising:

a base carrying metering components;

a dome coupled to the base; and tamper detection means for providing a recognizable indication of separation of a watthour meter from a meter socket jaw contact after the watthour meter has been connected to the jaw contact in the meter socket, the tamper detection means including:

at least one blade adaptable to be connected to a meter socket jaw contact, the blade moveably carried in the base; and tamper signaling means, responsive to movement of the blade upon separation of the watthour meter from the meter socket jaw contact, for generating a tamper detection signal, the tamper signaling means including:

a switch having a moveable plunger, the switch fixed to the blade to position the plunger in proximity with the base to detect movement of the base relative to the blade;

a switchable contact in the switch and responsive to plunger movement for providing a signal upon detection of movement of the blade relative to the base.

19. A watthour meter comprising:

abase;

a dome coupled to the base;

metering components mounted within the base and the dome; and tamper detection means for detecting tampering with the watthour meter, the tamper detection means including:

aligned openings formed through the base and the dome, the aligned openings having an end opening to an interior of the coupled base and dome;

a connecting pin mountable through the aligned openings and latched to at least one of the base and the dome, the connecting pin having an inner end; and tamper event signal generating means, mounted within the coupled base and dome, for generating a signal upon a change in position of the inner end of the connecting pin.

20. The watthour meter of claim 19 wherein:

the opening extending through the base is wider at an inner end than an opposed outer end.

21. The watthour meter of claim 20 wherein:
the aligned openings extending through the base and the dome at disposed at a non-parallel angle relative to the base.

22. The watthour meter of claim 19 wherein the pin comprises:
a stem extending between an inner end and an outer end of the pin; and
latch means, carried on the stem, for latching the pin to one of the base and the dome.

23. The watthour meter of claim 22 wherein the latch means comprises:
a bendable arm carried on the stem.

* * * * *

UNITED STATES PATENT AND TRADEMARK OFFICE
CERTIFICATE OF CORRECTION

PATENT NO. : 7,189,109 B2  Page 1 of 1
APPLICATION NO. : 10/956838
DATED : March 13, 2007
INVENTOR(S) : Darrell Robinson It is certified that error appears in the above-identified patent and that said Letters Patent is hereby corrected as shown below:

Title Page item 54 and col. 1
Please change the title of the invention to read: WATTHOUR METER WITH TAMPER DETECTION Signed and Sealed this Twenty-seventh Day of May, 2008

JON W. DUDAS
*Director of the United States Patent and Trademark Office*